US008823049B2

(12) United States Patent
Chen et al.

(10) Patent No.: US 8,823,049 B2
(45) Date of Patent: Sep. 2, 2014

(54) LIGHT-EMITTING DIODE WITH CURRENT-SPREADING REGION

(71) Applicant: Taiwan Semiconductor Manufacturing Company Ltd., Hsin-Chu (TW)

(72) Inventors: Ding-Yuan Chen, Taichung (TW); Chen-Hua Yu, Hsin-Chu (TW); Wen-Chih Chiou, Miaoli (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 0 days.

(21) Appl. No.: 13/793,198

(22) Filed: Mar. 11, 2013

(65) Prior Publication Data

US 2013/0264539 A1 Oct. 10, 2013

Related U.S. Application Data

(62) Division of application No. 12/539,757, filed on Aug. 12, 2009, now Pat. No. 8,399,273.

(60) Provisional application No. 61/089,823, filed on Aug. 18, 2008.

(51) Int. Cl.
*H01L 33/00* (2010.01)
(52) U.S. Cl.
USPC ............... 257/102; 257/103; 257/E33.011
(58) Field of Classification Search
CPC ............................ H01L 33/145; H01L 33/325
USPC ................................ 257/102, 103, E33.011
See application file for complete search history.

(56) References Cited

U.S. PATENT DOCUMENTS

| 5,391,917 | A | 2/1995 | Gilmour et al. |
| 5,510,298 | A | 4/1996 | Redwine |
| 5,550,391 | A | 8/1996 | Yamaguchi |
| 5,767,001 | A | 6/1998 | Bertagnolli et al. |
| 5,998,292 | A | 12/1999 | Black et al. |
| 6,184,060 | B1 | 2/2001 | Siniaguine |
| 6,322,903 | B1 | 11/2001 | Siniaguine et al. |

(Continued)

FOREIGN PATENT DOCUMENTS

JP 11186607 7/1999

OTHER PUBLICATIONS

Chinese Patent Office, Office Action dated Sep. 1, 2010, Application No. 200910166790.x, 6 pages.

(Continued)

*Primary Examiner* — Minh-Loan T Tran
(74) *Attorney, Agent, or Firm* — Haynes and Boone, LLP

(57) ABSTRACT

A light-emitting diode (LED) device is provided. The LED device has a lower LED layer and an upper LED layer with a light-emitting layer interposed therebetween. A current blocking layer is formed in the upper LED layer such that current passing between an electrode contacting the upper LED layer flows around the current blocking layer. When the current blocking layer is positioned between the electrode and the light-emitting layer, the light emitted by the light-emitting layer is not blocked by the electrode and the light efficiency is increased. The current blocking layer may be formed by converting a portion of the upper LED layer into a resistive region. In an embodiment, ions such as magnesium, carbon, or silicon are implanted into the upper LED layer to form the current blocking layer.

19 Claims, 5 Drawing Sheets

(56) References Cited

U.S. PATENT DOCUMENTS

| | | |
|---|---|---|
| 6,448,168 B1 | 9/2002 | Rao et al. |
| 6,465,892 B1 | 10/2002 | Suga |
| 6,472,293 B1 | 10/2002 | Suga |
| 6,531,328 B1 | 3/2003 | Chen |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,247,565 B2 | 7/2007 | Keum |
| 7,247,985 B2 * | 7/2007 | Kaneko et al. ............... 313/506 |
| 7,262,495 B2 | 8/2007 | Chen et al. |
| 7,271,021 B2 | 9/2007 | Yang et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,582,496 B2 | 9/2009 | Lee et al. |
| 7,619,296 B2 | 11/2009 | Nakashiba |
| 2005/0093428 A1 | 5/2005 | Kaneko et al. |
| 2005/0280022 A1 | 12/2005 | Ueda et al. |
| 2007/0108452 A1 | 5/2007 | Kauer |
| 2007/0114545 A1 | 5/2007 | Jang et al. |
| 2008/0111139 A1 | 5/2008 | Chae et al. |
| 2011/0241040 A1 | 10/2011 | Yu |

OTHER PUBLICATIONS

US Patent Office, unpublished U.S. Appl. No. 13/405,906, filed Feb. 7, 2012, 32 pages.

Chang, S. J., et al., "Nitride-Based LEDs with an Insulating $SiO_2$ Layer Underneath p-Pad Electrodes," Electrochemical and Solid-State Letters, vol. 10, No. 6, 2007, pp. H175-H177.

Chowdhury, S., et al., "Enhancement and Depletion Mode AlGaN/GaN CAVET with Mg—Ion=Implanted GaN as Current Blocking Layer," IEEE Electron Device Letters, vol. 29, No. 6, Jun. 2008, pp. 543-545.

Huh, C., et al., "Improvement in light-output efficiency of InGaN/GaN multiple-quantum well light-emitting diodes by current blocking layer," Journal of Applied Physics, vol. 92, No. 5, Sep. 1, 2002, pp. 2248-2250.

* cited by examiner

LIGHT-EMITTING DIODE WITH CURRENT-SPREADING REGION

PRIORITY DATA

This application is a divisional application of U.S. patent application Ser. No. 12/539,757, filed Aug. 12, 2009, entitled "Light-Emitting Diode With Current-Spreading Region," which is a Utility Application of U.S. Provisional Application Ser. No. 61/089,823, filed on Aug. 18, 2008, entitled "Light-Emitting Diode with Current-Spreading Region," the disclosures of each of which are hereby incorporated by reference in their entirety.

TECHNICAL FIELD

This invention relates generally to semiconductor devices and, more particularly, to crystalline group III-V light-emitting diodes.

BACKGROUND

Light-emitting diodes (LEDs) are manufactured by forming active regions on a substrate and by depositing various conductive and semiconductive layers on the substrate. The radiative recombination of electron-hole pairs can be used for the generation of electromagnetic radiation (e.g., light) by the electric current in a p-n junction. In a forward-biased p-n junction fabricated from a direct band gap material, such as GaAs or GaN, the recombination of the electron-hole pairs injected into the depletion region causes the emission of electromagnetic radiation. The electromagnetic radiation may be in the visible range or may be in a non-visible range. Different color LEDs may be created by using materials with different band gaps. Further, an LED emitting electromagnetic radiation at a particular wavelength range may direct the radiation towards a phosphor that absorbs the radiation and emits radiation of one or more different wavelengths. So, for example, an LED emitting non-visible light may direct that light toward a phosphor that transforms the non-visible light into visible light.

Generally, LED structures have a light-emitting layer interposed between a lower layer and an upper layer, wherein the upper layer and the lower layer have opposite types of conductivity. Electrodes are formed to contact the lower and the upper layers. Current flowing from between the electrodes and the light-emitting layer takes the least electrically resistive path. In many configurations in which the upper electrode is positioned directly above the light-emitting layer, much of the light emitted by the light-emitting layer is blocked by the upper electrode, thereby significantly decreasing the light efficiency of the LED structure.

One attempt to limit the light-blocking effect of the upper electrode to increase the light efficiency of the LED structure involves forming a dielectric layer on a portion of the light-emitting layer prior to the forming of the upper layer. The upper electrode is positioned over the dielectric layer such that current flowing between the upper electrode and the lower layer of the LED structure are forced around the dielectric layer. As a result, the current flows between the upper layer and the lower layer at locations not directly under the upper electrode, thereby limiting the amount of light blocked by the upper electrode and increasing the light efficiency of the LED structure.

The dielectric layer is typically formed by depositing and patterning a layer of silicon dioxide on the light-emitting layer. The deposition and patterning steps add additional cost and complexity to the standard LED fabrication process. Furthermore the patterning steps typically comprise an etch process that may damage the surface of the light-emitting layer and reduce its crystal quality. This damage may adversely affect the quality of the LED devices and reduce the yield.

Accordingly, there is a need for an LED device having an increased light efficiency and methods for producing such a device.

SUMMARY OF THE INVENTION

These and other problems are generally reduced, solved or circumvented, and technical advantages are generally achieved, by embodiments of the present invention, which provides light-emitting diodes (LEDs) having a planar surface.

In accordance with one aspect of the present invention, an LED device is provided. The LED device includes a substrate having an LED structure formed thereon. The LED structure includes a lower layer, a light-emitting layer, and an upper layer. A current blocking layer is formed in the upper layer such that the upper layer maintains a planar surface. The current blocking layer may be formed by, for example, implanting ions, such as magnesium, carbon, silicon, or other ions, into the upper layer to create a resistive region. Another upper layer may be formed over the upper layer after the ion implant.

In accordance with another aspect of the present invention, a method of forming an LED device is provided. The method includes providing a substrate and forming an LED structure on the substrate, wherein the LED structure includes a first layer, an active layer, and a second layer. Thereafter, a current blocking layer is formed in the second layer by, for example, forming a resistive region. The resistive region may be formed by, for example, implantation. After implanting, another layer may be formed over the second layer.

In accordance with yet another aspect of the present invention, another method of forming an LED device is provided. The method includes providing a substrate and forming an LED structure on the substrate. The LED structure may include one or more lower layers, one or more light-emitting layers, and one or more first upper layers. Ions are implanted into at least one of the one or more first upper layers to form a resistive layer. One or more second upper layers may be formed over the one or more first upper layers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Novel methods for forming light-emitting diodes (LEDs) are provided. It should be understood that steps necessary to illustrate the inventive aspects of the invention are shown, but other processes already known in the art may also be performed. Throughout the various views and illustrative embodiments of the present invention, like reference numbers are used to designate like elements.

Figure 1:
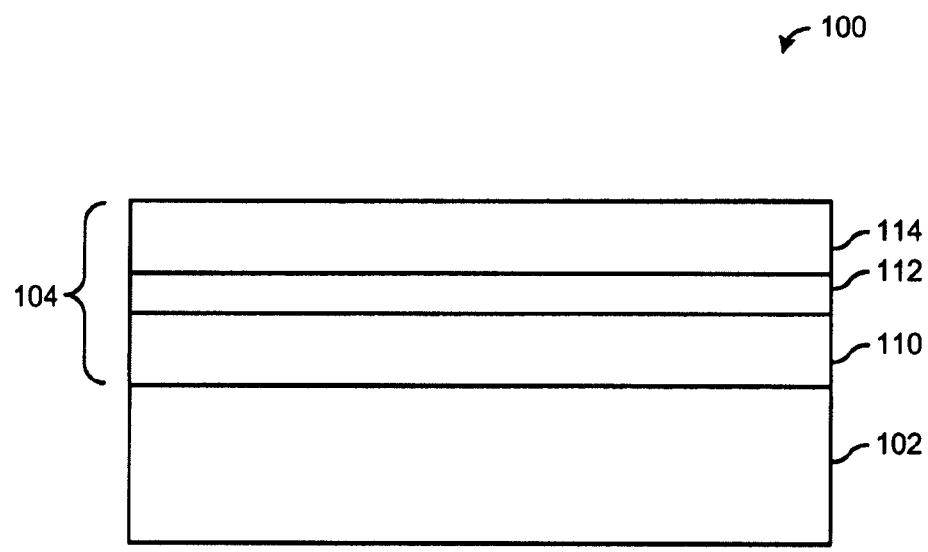
FIGS. 1-2 and 3A illustrate various process steps, and FIG. 3B illustrate a flow chart (FIGS. 3A and 3B may be hereinafter collectively referred to as FIG. 3), of manufacturing a light-emitting diode device in accordance with an embodiment of the present invention.
Figure 2:
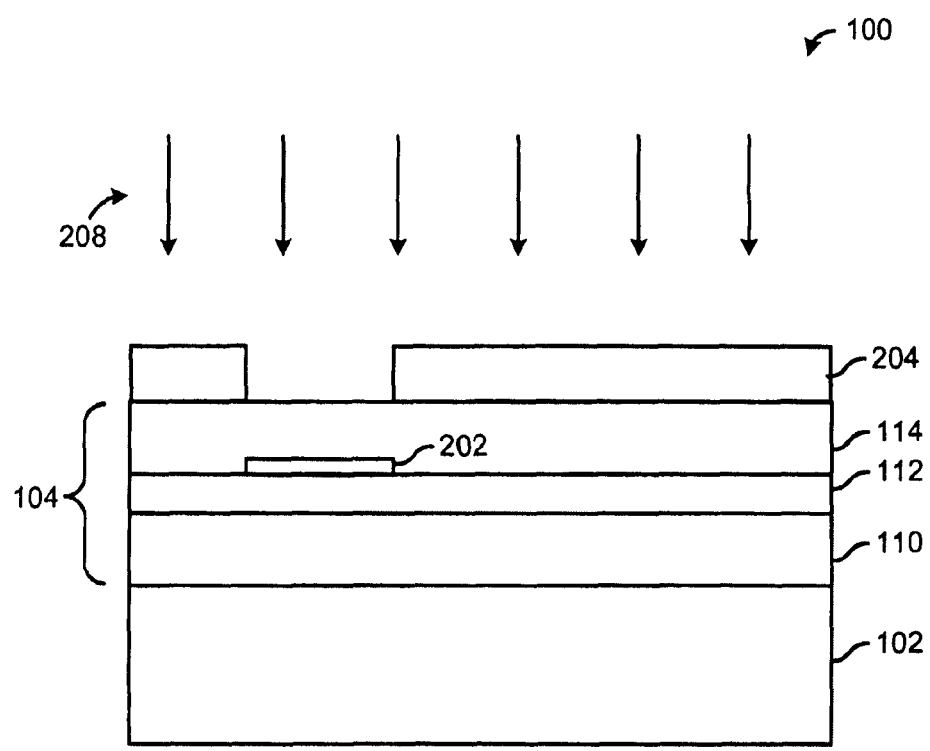
Figure 3A:
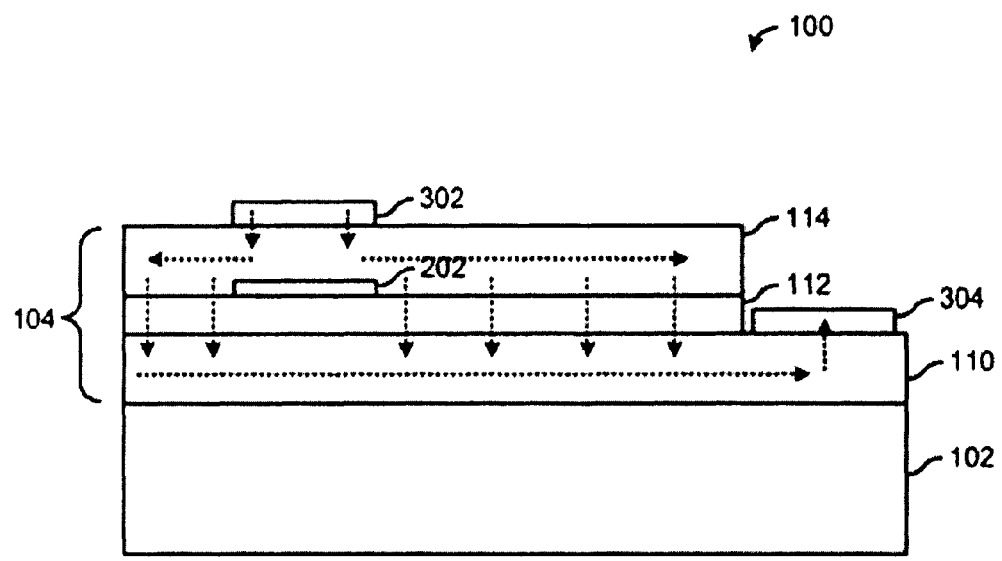
Figure 3B:
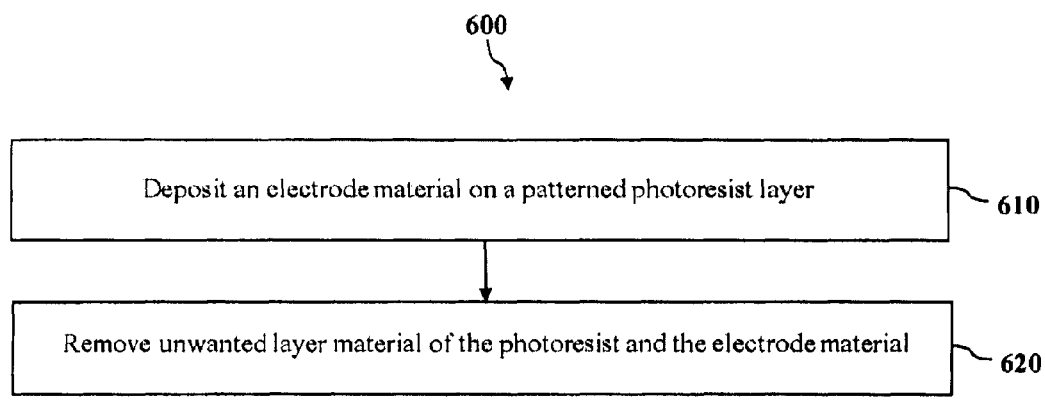

FIGS. 1-3 illustrate various intermediate process steps of forming a light-emitting diode (LED) device 100 with a current-blocking layer in accordance with an embodiment of the present invention. Referring first to FIG. 1, the LED device 100 is shown as including a substrate 102 with an LED structure 104 formed thereon. The substrate 102 is preferably a bulk sapphire or silicon substrate, doped or undoped. It should be noted that while embodiments of the present invention are described in the context of using a sapphire substrate, other substrates may be used. For example, other substrates commonly employed in the fabrication of LEDs, such as SiC substrates, may also be used in certain embodiments. Furthermore, substrates with various surface orientations, such as (111), (100), or (110) may be used.

The LED structure 104 may comprise any LED structure suitable for a particular application. Generally, the LED structure 104 includes a lower LED layer 110 formed over the surface of the substrate 102. Preferably, the lower LED layer 110 is formed of a group III-V compound doped with a dopant of a first conductivity type. For example, a group III-N compound such as n-GaN having an n-type conductivity may be used. The lower LED layer 110 of n-GaN may be formed by, for example, a selective epitaxial growth process such as a molecular-beam epitaxy (MBE), metal organic chemical vapor deposition (MOCVD), hydride vapor phase epitaxy (HVPE), liquid phase epitaxy (LPE), or the like. Other group III-N materials that may be used include, for example, GaN, InN, AlN, $In_xGa_{(1-x)}N$, $Al_xGa_{(1-x)}N$, $Al_xIn_yGa_{(1-x-y)}N$, or the like. Other group III-V materials may also be used.

A light-emitting layer 112 (also sometimes referred to as an active layer) is formed on the lower LED layer 110. The light-emitting layer 112 may include a homojunction, heterojunction, single-quantum well (SQW), multiple-quantum well (MQW), or the like, structure. In an exemplary embodiment, light-emitting layer 112 comprises undoped n-type gallium indium nitride $(Ga_xIn_yN_{(1-x-y)})$. In alternative embodiments, light-emitting layer 112 includes other commonly used materials such as $(Al_xIn_yGa_{(1-x-y)}N)$. In yet other embodiments, light-emitting layer 112 may be a multiple quantum well including multiple well layers (such as InGaN) and barrier layers (such as GaN) allocated in an alternating pattern. Again, the formation methods include MOCVD, MBE, HYPE, LPE, or other applicable CVD methods.

An upper LED layer 114 is disposed on the light-emitting layer 112. The upper LED layer 114 is preferably formed of a group III-N compound doped with a dopant of a second conductivity type, opposite of the first conductivity type, such as p-GaN, and may be formed by a process similar to the lower LED layer 110.

It should be noted that the above description provides a general overview of the construction of an LED structure for illustrative purposes. Other layers, such as a distributed Bragg reflector, omni-directional reflectors, buffer/nucleation layers, cladding/contact layers, or the like, may also be present as required and/or desired for a particular application. Furthermore, it should be noted that where a layer was described as a single layer, a plurality of layers may be used comprising of the same or different materials. For example, the lower and upper LED layers may each comprise one or more contact layers and one or more cladding layers, which may both be formed of the same or different materials. The structure of the LED structure may also vary depending on the type of materials used and the intended application. It is expected that many types of LED structures may be used with embodiments of the present invention.

FIG. 2 illustrates the formation of a current-blocking layer (CBL) 202 in the upper LED layer 114 in accordance with an embodiment of the present invention. The CBL 202 comprises a region formed in the upper LED layer 114, or other conductive layer/substrate formed over the LED structure 104, of a resistive material. It should be noted that the CBL 202 is positioned along the bottom of the upper LED layer 114 for illustrative purposes only. The CBL 202 may be positioned at any vertical position within the upper LED layer 114. For example, the CBL 202 may be positioned along the top surface or in the middle of the upper LED layer 114.

The region of resistive material within the CBL 202 is formed by implanting impurities into the upper LED layer 114. In an illustrative embodiment, the region of resistive material is formed by implanting magnesium ions into the upper LED layer 114. In this embodiment, a photoresist layer 204 is formed by spin-coating and patterned using photolithography techniques. The photoresist layer 204 is used to perform a selective implant into the upper LED layer 114 to form the CBL 202. In the illustrative embodiment, the CBL 202 is formed by implanting magnesium ions at a dose of about $1.\times.10.^{14}$ to about $1.\times.10.^{15}$ atoms/$cm.^2$ and at an energy of about 10 to about 100 KeV, as indicated by the arrows 208. The vertical position of the profile peak of the CBL 202, which is the point of maximum concentration of the implanted impurities within the upper LED layer 114, may be adjusted by controlling the implant energy. Other process conditions may be used. Also, other impurities, such as Si, C, or the like, that create a relatively more resistive region in the upper LED layer 114, may also be used. The CBL 202 preferably has a width of about 50 Å to about 500 µm.

FIG. 3 illustrates a top electrode 302 and a bottom electrode 304 in accordance with an embodiment of the present invention. The top electrode 302 may be formed, for example, by a self-aligned "lift-off" process wherein the top electrode 302 is deposited on the patterned photoresist layer 204 and the unwanted layer material of the photoresist layer 204 and the electrode material are then removed. The top electrode 302 provides an electrical connection to the upper LED layer 114, and the bottom electrode 304 provides an electrical connection to the lower LED layer 110. In an embodiment in which the lower LED layer 110 is n-type, then the bottom electrode 304 is preferably an ohmic contact formed of one or more layers of a metal or metal alloy, such as an alloy containing Ti/Al, Ti/Au, or the like. In this embodiment, the top electrode 302 makes ohmic contact with the p-type upper LED layer 114 and may be formed of one or more layers of a metal or metal alloy, such as an alloy containing Ni/Au or the like.

One of ordinary skill in the art will appreciate that the top electrode 302 is positioned above the CBL 202. Without the CBL 202, the current flowing from the top electrode 302 through the light-emitting layer 112 to the lower LED layer 110 is a substantially direct route. As a result, much of the light emitted by the light-emitting layer 112 is blocked by the top electrode 302, greatly reducing the light-emitting efficiency of the LED device. By placing the top electrode 302 above the CBL 202, the current that would normally flow along the most direct route between the top electrode 302 and the lower LED layer 110 is forced around the CBL 202 as indicated by the dotted lines of FIG. 3. As the current flows between the upper LED layer 114 and the lower LED layer 110, the light emitted by the light-emitting layer 112 is not substantially blocked by the top electrode 302.

Figure 4:
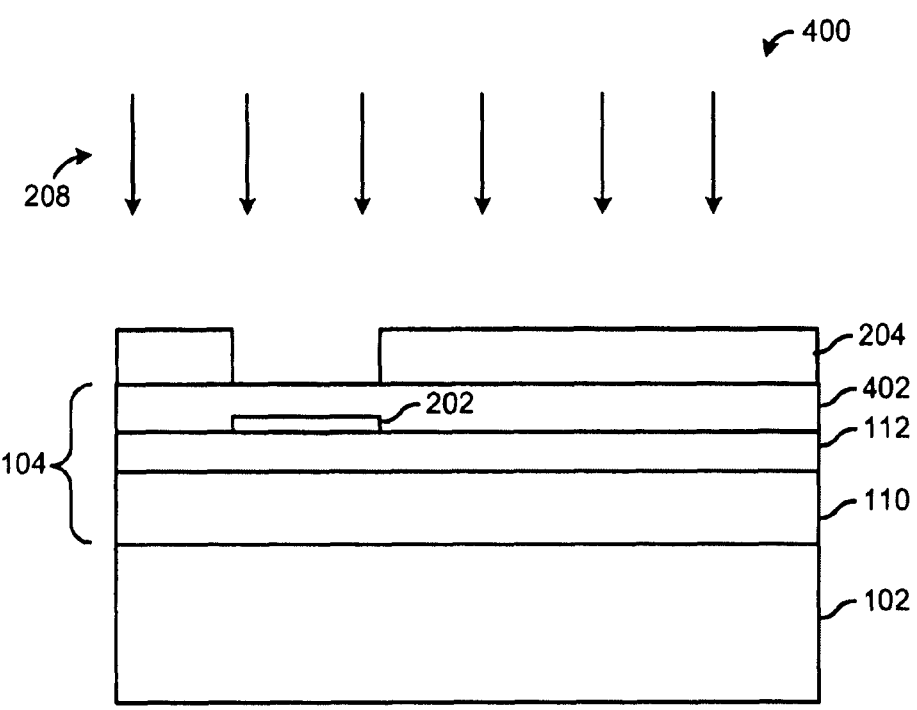
FIGS. 4 and 5 illustrate various process steps of manufacturing a light-emitting diode device in accordance with another embodiment of the present invention.
Figure 5:
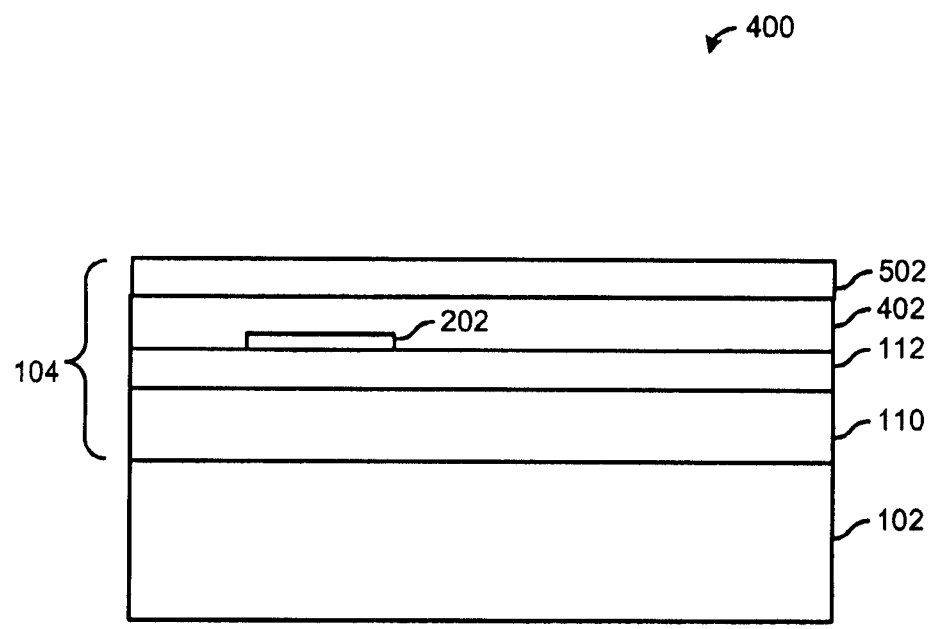

FIGS. 4 and 5 illustrate a method of forming an LED device 400 in accordance with another embodiment of the present invention. FIG. 4 comprises substantially the same layers and may be formed using similar processes and materials as the LED device 100 discussed above with reference to FIGS. 1 and 2, except that the upper LED layer (114 in FIGS. 1-3) is replaced by a first upper LED layer 402. The first upper LED layer 402 of FIG. 4 is formed having a thickness less than the desired final thickness of the upper LED layer 114 of FIGS. 1-3.

For the previously described embodiments exemplified in FIGS. 1-3, it has been found that the implant process used to form the CBL 202 may damage the surface of the upper LED layer 114. It has also been found that the formation and removal of the photoresist layer 204 may also damage the surface of the upper LED layer 114. In some cases the damage to the surface of the upper LED layer 114 may adversely affect the formation of and the electrical contact with overlying layers, such as the top electrode 302, and possibly adversely affect the performance and reliability of the LED device. In embodiments in which the damage to the surface of the upper LED layer 114 is greater than desired for a particular application, it is preferred that the upper LED layer 114 is formed to have a thickness less than a desired thickness, as illustrated by the first upper LED layer 402 of FIG. 4. The CBL 202 is formed in the first upper LED layer 402 by implanting magnesium ions as illustrated by arrows 208. The CBL 202 may be formed in a similar manner as discussed above with reference to FIG. 2. An activation anneal may be performed before or after formation of the CBL 202.

FIG. 5 illustrates the LED device 400 after a second upper LED layer 502 is formed over the first upper LED layer 402 in accordance with an embodiment of the present invention. The second upper LED layer 502 may be formed of the same materials using similar processes as those used for the first upper LED layer 402. The second upper LED layer 502 is formed to a thickness such that the combined thickness of the first upper LED layer 402 and the second upper LED layer 502 is about 1000 .ANG. to about 3000 .ANG., but the second upper LED layer 502 preferably has a thickness of about 300 .ANG. to about 2700 .ANG.

One of ordinary skill in the art will realize that by forming the second upper LED layer 502 over the first upper LED layer 402, surface damage to the first upper LED layer 402 is repaired, thereby providing a better surface for forming overlying layers and making electrical contacts.

Thereafter, processes may be performed to complete the LED device 400. Including, for example, forming the top electrode 302 and the bottom electrode 304 as illustrated in FIG. 3. The operation to the LED device 400 is similar to the operation of the LED device 100 discussed above with reference to FIG. 3.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A light-emitting diode (LED) device comprising:
a substrate;
an LED structure formed on the substrate, the LED structure including an upper layer and a lower layer with a light-emitting layer positioned between the upper layer and the lower layer; and
a current blocking layer formed in the upper layer, wherein the current blocking layer comprises a region of resistive material comprising implanted impurities;
wherein:
the upper layer includes a first layer and a second layer;
the current blocking layer is formed in the first layer; and
the second layer and the light-emitting layer are disposed on opposite sides of the first layer.

2. The LED device of claim 1, wherein the implanted impurities comprise magnesium, carbon, or silicon ions implanted or diffused into the upper layer.

3. The LED device of claim 1, further comprising a first electrode and a second electrode positioned on a first side of the substrate, the first electrode contacting the upper layer and the second electrode contacting the lower layer.

4. The LED device of claim 3, wherein the first electrode is positioned above the current blocking layer.

5. The LED device of claim 1, wherein the current blocking layer has a width of about 50 Å to about 500 μm.

6. A photonic lighting device, comprising:
a substrate;
a first layer disposed over the substrate, the first layer containing a first group III-V compound having a first type of conductivity;
an active layer disposed over the first layer;
a second layer disposed over the active layer, the second layer containing a second group III-V compound having a second type of conductivity different from the first type, wherein the second layer has a same material composition throughout;
a current blocking layer disposed in the second layer; and
an electrode disposed over, and electrically coupled to, the second layer, the electrode being aligned with the currently blocking layer.

7. The photonic lighting device of claim 6, further comprising a further electrode disposed over, and electrically coupled to, the first layer.

8. The photonic lighting device of claim 6, wherein the current blocking layer includes a resistive region.

9. The photonic lighting device of claim 8, wherein the resistive region contains implanted impurities.

10. The photonic lighting device of claim 9, wherein the implanted impurities include at least one of: silicon, carbon, or magnesium ions.

11. The photonic lighting device of claim 6, wherein the current blocking layer has a width in a range from about 50 angstroms to about 500 microns.

12. The photonic lighting device of claim 6, wherein:
the first group III-V compound includes n-doped gallium nitride;

the second group III-V compound includes p-doped gallium nitride; and the active layer includes a multiple quantum well.

13. The photonic lighting device of claim 6, wherein the electrode contains at least one of: titanium, aluminum, gold, nickel, or alloys thereof.

14. The photonic lighting device of claim 6, wherein the substrate contains one of: sapphire, silicon, or silicon carbide.

15. A light-emitting diode, comprising:
a substrate;
a first semiconductor layer located over the substrate, the first semiconductor layer containing an n-doped group III-V compound;
a multiple quantum well located over the first semiconductor layer;
a second semiconductor layer located over the multiple quantum well, the second semiconductor layer containing a p-doped III-V compound having a uniform material composition throughout;
a resistive current blocking element located in the second semiconductor layer;
a first electrode located over, and electrically coupled to, the first semiconductor layer;
a second electrode located over, and electrically coupled to, the second semiconductor layer, the second electrode being vertically aligned with the currently blocking element.

16. The light-emitting diode of claim 15, wherein the current blocking element contains implanted impurities.

17. The light-emitting diode of claim 16, wherein the implanted impurities include at least one of: silicon, carbon, or magnesium ions.

18. The light-emitting diode of claim 15, wherein the current blocking element has a width in a range from about 50 angstroms to about 500 microns.

19. The light-emitting diode of claim 15, wherein:
the substrate contains one of: sapphire, silicon, or silicon carbide;
the n-doped III-V compound includes n-doped gallium nitride;
the p-doped group III-V compound includes p-doped gallium nitride; and
the first and second electrodes each contain at least one of: titanium, aluminum, gold, nickel, or alloys thereof.

* * * * *